United States Patent [19]

Desmond

[11] 4,270,138
[45] May 26, 1981

[54] ENHANCED THERMAL TRANSFER PACKAGE FOR A SEMICONDUCTOR DEVICE

[75] Inventor: Richard J. Desmond, North Syracuse, N.Y.

[73] Assignee: General Electric Company, Auburn, N.Y.

[21] Appl. No.: 17,032

[22] Filed: Mar. 2, 1979

[51] Int. Cl.³ .................. H01L 23/02; H01L 39/02; H01L 23/80

[52] U.S. Cl. ........................ 357/81; 357/72; 357/80; 357/68; 174/16 HS

[58] Field of Search ............ 174/16 HS; 357/81, 74, 357/80, 72, 68

[56] References Cited

U.S. PATENT DOCUMENTS

| | | | |
|---|---|---|---|
| 3,601,667 | 8/1971 | Desmond | 357/81 |
| 3,609,471 | 9/1971 | Scace | 357/81 |
| 3,629,672 | 12/1971 | Water | 357/81 |
| 3,706,915 | 12/1972 | Lootens et al. | 357/81 |
| 3,729,573 | 4/1973 | Dunn | 357/81 |
| 3,763,403 | 10/1973 | Lootens | 357/81 |
| 3,783,345 | 1/1974 | Taylor et al. | 357/81 |
| 3,783,347 | 1/1974 | Vladik | 357/81 |

FOREIGN PATENT DOCUMENTS 2733724  2/1978  Fed. Rep. of Germany ............ 357/81

Primary Examiner—Andrew J. James
Attorney, Agent, or Firm—Robert J. Mooney; Stephen B. Salai

[57] ABSTRACT

A semiconductor device for flush mounting to an external heatsink includes an integral encapsulating body and an internal heatsink having a surface for heat transfer to an external heatsink. The encapsulating body encloses a semiconductor element and a portion of the internal heatsink but has a lower surface which when mounted to the external heatsink, lies above the surface thereof thereby insuring that flush mounting can be consistently achieved.

7 Claims, 10 Drawing Figures

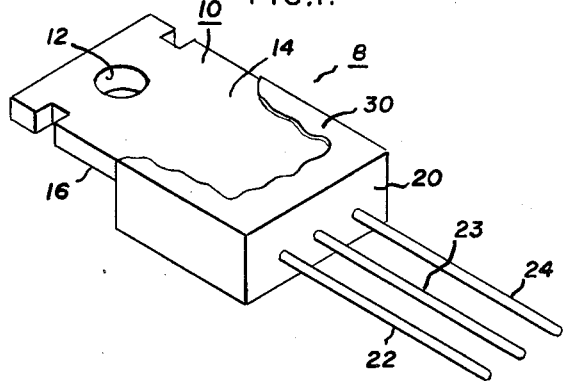
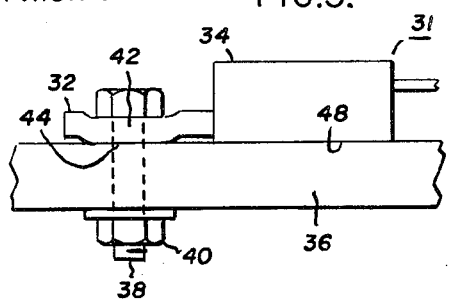
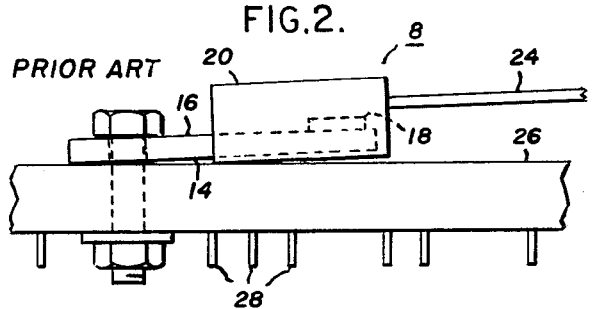
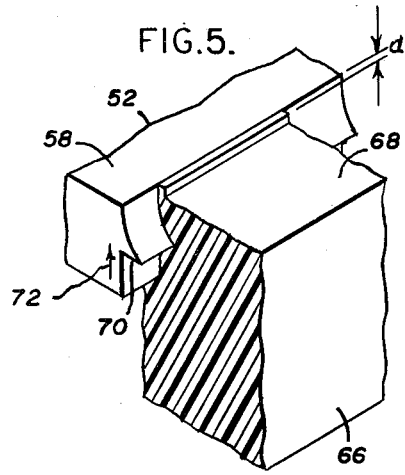
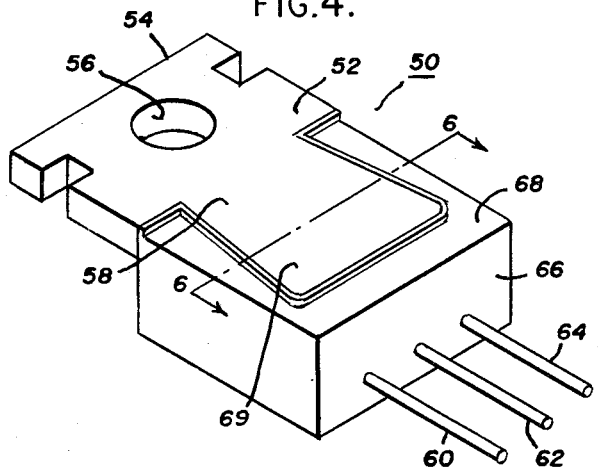
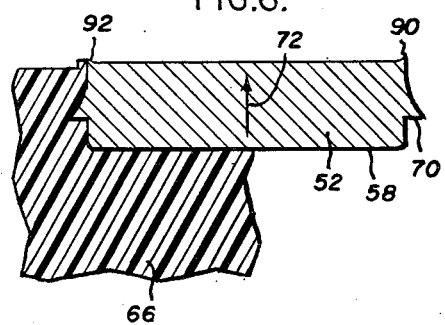

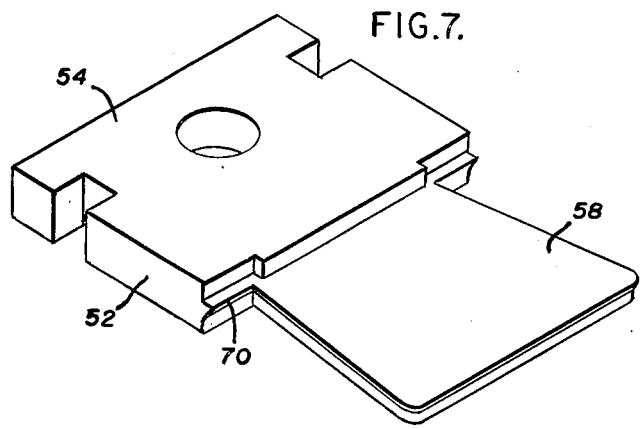
FIG.7.
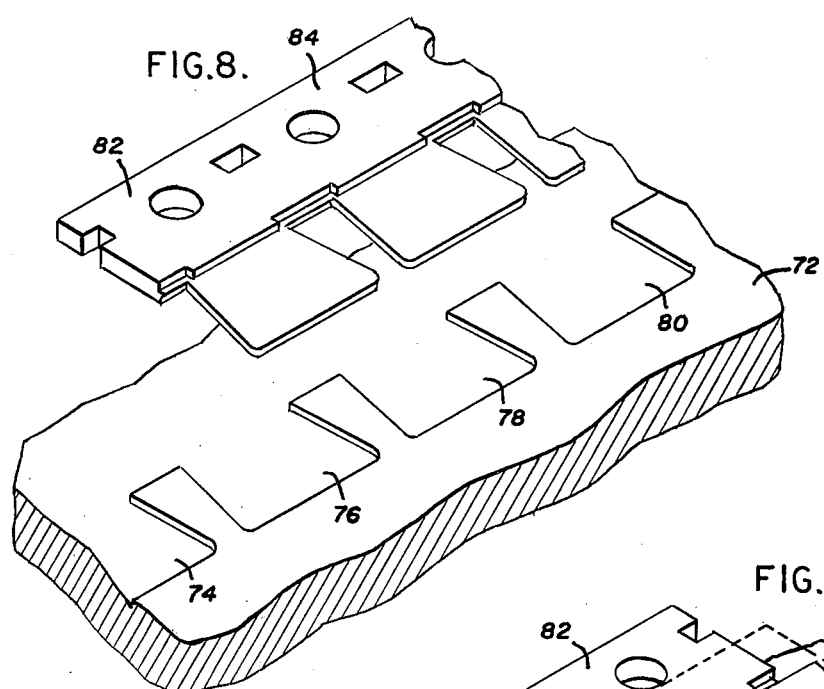
FIG.8.
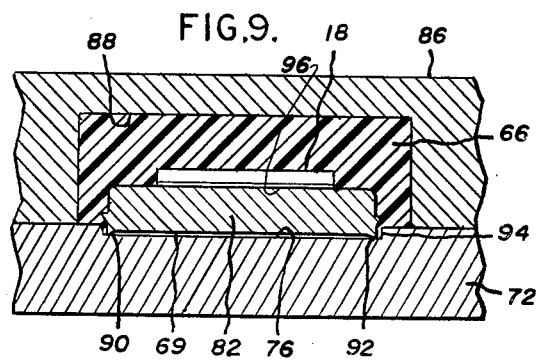
FIG.9.
FIG.10.

ENHANCED THERMAL TRANSFER PACKAGE FOR A SEMICONDUCTOR DEVICE

This invention relates in general to semiconductor devices and more particularly to a semiconductor device having an integral, thermally conductive base for mounting to an external heatsink.

It is commonplace to provide for the cooling of semiconductor devices by mounting such devices to an external heatsink or heat exchanger which removes potentially destructive heat from a device, thus maintaining the temperature thereof at a safe level. An example of semiconductor devices of this type is the TO-220 package which is registered by JEDEC and is an industry standard. This package is characterized by a thermally conductive base which is most commonly of metal on which a semiconductor element is mounted in order to achieve low thermal impedance therebetween. The semiconductor device may be mounted either in low electrical impedance connection with the base or electrically isolated from the base, but in low thermal impedance connection therewith. The semiconductor element is encapsulated by a material which protects it from its operating environment. Typically, epoxy or siicon encapsulants are used. In order to provide mechanical strength between the thermally conductive base and the encapsulant, a portion of the base is usually included within the encapsulated portion of the device. Further, it is commonplace to provide a locking structure which may take the form of a projection from the sides of the thermally conductive base which is included within the encapsulated portion of the device and which locking structure increases the mechanical strength of the bond.

It has been a problem of devices of the type hereinabove described that the spatial relationship between the encapsulated portion and the thermally conductive heatsink portion has been difficult to maintain during manufacture. Quite commonly, the bottom surface of the encapsulated portion has extended below the plane of the heatsinkable portion which mounts to external heat exchanger means. Several disadvantages result from this relationship. Upon mounting, the encapsulating portion interferes with the heatsinkable portion of the device which is subject to distortion since it no longer presents a flat surface to the external heat transfer means. Stresses are exerted on the encapsulated portion of the device which tend to disengage it from the heatsinkable base portion and further to exert stresses on the semiconductor element itself; also, the interposition of relatively high thermal impedance encapsulant between the thermally conductive base and the heat exchange medium seriously degrades the heat transfer characteristics of the semiconductor device heat exchanger interface.

Semiconductor devices of the type to which this invention is addressed are commonly manufactured by mounting the semiconductor element to the heatsink protion of the device and then transfer molding the encapsulant portion of the device over the semiconductor element. Although tight control of dimensional tolerances are maintained during the mold making process, variations in dimensions are commonly encountered between said mold and assembled heatsink parts during the encapsulation process. Bow, warp, camber, and noncoplanar conditions of assemblies are a common cause.

It is an object therefore of this invention to provide a semiconductor device which overcomes the above-stated disadvantages of the prior art.

It is another object of this invention to provide a semiconductor device having an integral heatsinkable portion which presents a flat surface to a heat exchanger for mounting thereon which surface is undisturbed by the unintentional presence of encapsulating material thereon.

It is still another object of this invention to provide a semiconductor device which achieves the aforesaid advantages at a low manufacturing cost.

It is a further object of this invention to provide a semiconductor device which when mounted to an external heat exchanger, produces no substantial stress on an encapsulated portion of the device and which, therefore, is less subject to mechanical failure than prior devices.

It is a still further object of this invention to provide a semiconductor device which may be manufactured according to processes which do not substantially deviate from those currently employed so as to allow ready implementation on existing assembly lines.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

FIG. 1 is a device of the type to which the present invention is addressed, but fabricated in accordance with the techniques of the prior art;

FIGS. 2 and 3 are views of devices of a type illustrated in FIG. 1 showing the distortion thereof when the device is mounted to an external heat exchanger, and one method for partially reducing such distortion.

FIG. 4 is an overall view of a device in accordance with the instant invention;

FIG. 5 is a detail of the device of FIG. 4 particularly showing the structure of the locking member of the device;

FIG. 6 is a further cross sectional detail of the device of FIG. 4 particularly showing a burr which may be formed during the fabrication of the base which may be used to advantage;

FIG. 7 is a view of the heatsink member of a device in accordance with this invention prior to mounting a semiconductor element thereon, and, prior to encapsulation.

FIGS. 8 and 9 are drawings of a mold suitable for fabricating the device of this invention.

FIG. 10 is a view of a device in accordance with this invention showing its relation to the mold.

Referring now to FIG. 1, a semiconductor device 8 of the type to which this invention is addressed, but fabricated according to the teachings of the prior art, is illustrated. Those skilled in the art will recognize that the form of the device is that of a TO-220 package as defined by JEDEC. While specific mention is made of the TO-220 package and this invention is illustrated by reference to examples thereof, those skilled in the art will recognize that other semiconductor devices having different forms are also suitable for application of the instant invention thereto.

The device of FIG. 1 includes a heatsinkable base 10 having a mounting hole 12 therethrough. Base 10 includes a first flat surface 14 which is adapted to be mounted to a similar surface of an external heat exchanger for cooling of a semiconductor element mounted to a second major surface 16 of the base. A semiconductor element 18 is shown mounted to surface 16 of base 10 in FIG. 2. Semiconductor element 18 is enclosed by encapsulant 20 which surrounds the semiconductor element, a portion of base 10, and a portion of leads 22, 23, and 24, which leads provide electrical connection (not illustrated) to semiconductor element 18.

FIG. 2 illustrates the mounting of device 8 to heat exchanger 26. Heat exchanger 26 need take no particular form in accordance with this invention and may be cooled by conventional means. Oftentimes, fins 28 are provided to enhance cooling. Reference to FIG. 2 clearly illustrates a disadvantage of semiconductor devices according to the prior art. During encapsulation, it is extremely difficult to maintain the tolerances necessary to insure that encapsulant 20 will not enclose at least a portion of surface 14 of base 10. The presence of a thin layer 30 of encapsulant 20 on surface 14 of device 8, which thin layer is commonly referred to as flash, interferes with the mounting of device 8 to heatsink 26 and results in the oblique mounting as illustrated at FIG. 2. While the degree of obliqueness of mounting has been exaggerated somewhat for purposes of illustration, the presence of flash on the back surfaces of the devices of the type which FIG. 1 represents is a serious problem and the reduction in heat transfer capacity between device 8 and heatsink 26 is oftentimes on the order of 20 percent or more. Although deflashing operations are employed for flash removal following device encapsulation, it is often found that surface 30 of FIG. 1 is nevertheless elevated above surface 14, preventing flush mounting.

An additional problem oftentimes observed in mounting devices in accordance with the prior art to heat exchange mediums is that whenever encapsulant 20 presents a surface to heat exchanger 26 which lies below the plane of surface 14, forces are exerted on the encapsulating medium which tend to separate it from base 10. These forces are transmitted to semiconductor element 18 and tend to weaken the bond between the device and surface 16 of base 10. These stresses on the device are oftentimes responsible for premature failure, in severe cases by cracking of the device and, where actual cracking does not occur, through thermal fatigue, or the like.

In an attempt to alleviate the problem hereinabove described, the structure of FIG. 3 has sometimes been used for providing devices of the type to which this invention is addressed. Device 31 of FIG. 3 includes essentially the same elements as device 8 of FIGS. 1 and 2. A base 32 and an encapsulated portion 34 house a semiconductor element (not shown). Base 32 is mounted to an external heatsink 36 by bolt 38 and nut 40. Base 32 differs from base 10 of FIGS. 1 and 2 in that a coined or formed region 42 is provided which elevates the interfering portion of surface 48 above mounting surface 44. In this way, no stress is produced on encapsulated portion 34 by heat exchanger 36. Although there is a small area of relatively good thermal contact between base 32 and heat exchanger 36, the majority of base 32 is not in direct thermal contact with heat exchanger 36 and the thermal impedance of the connection is therefore increased and field performance of the device downgraded.

FIG. 4 illustrates a semiconductor device 50 in accordance with the instant invention which exhibits substantially improved properties over prior art devices. Device 50 includes a thermally conductive base 52, which may be electrically conductive as well, and is conveniently manufactured of copper, steel, aluminum, or the like. In a presently preferred embodiment of this invention, base 52 is manufactured of copper and is formed by punching individual bases from a strip of copper material, leaving the individual bases connected or nonconnected, as desired, at the mounting end 54 thereof, as illustrated, for example, in FIGS. 7 and 8.

Base 52 includes a mounting hole 56 for accommodating a bolt or other mounting device. Base 52 further includes a tongue portion 58 to one surface of which a semiconductor element may be bonded by soldering, or the like, in a thermally conductive relationship. It will be understood by those skilled in the art that devices of the type represented by the device 50 may be fabricated wherein the semiconductor element is either electrically isolated from base 52 or electrically connected thereto Where isolation is desired, it is well known to interpose a layer of insulating material as illustrated in FIG. 9 by layer 96 between the semiconductor element and the surface of tongue 58 to which layer the element is mounted. In such cases, leads 60, 62, and 64 provide all the electrical connections to the semiconductor element. Where ohmic contact between base 52 and the semiconductor element is provided, base 52 may itself provide one of the electrical contacts to the semiconductor element. The particular means for connecting leads 60, 62, and 64 to the semiconductor element housed by device 50 are well known to those skilled in the art and as such form no particular part of this invention.

Encapsulating housing 66 encloses the semiconductor element as well as a portion of the sidewalls of tongue 58. Encapsulant 66 includes a lower surface 68 which lies in a plane which is separated from the plane including surface 69 of tongue 58 by a distance sufficient to insure that, allowing for the tolerances maintainable during manufacture, no portion of encapsulant 66 lies beyond the plane of surface 69, and a minimum amount, easily removed by deflashing, lies in that plane. In this way, it is insured that a substantially flat surface will be presented to the heat exchanger by base 52 unencumbered by encapsulant. In accordance with a presently preferred embodiment of this invention, a spacing "d" between the plane of surface 69 and the plane of surface 68 of between about 0.003 and 0.005 inches is found to yield satisfactory results.

FIG. 5 is an enlarged detail of a portion of device 50 showing the structure of a lock for anchoring encapsulating portion 66 to base 52. The lock comprises peripheral extension 70 from the sidewall of base 52 and, more particularly, from the sidewall of tongue portion 58 of base 52. Lock 70 may be conveniently formed by coining base 70 in the direction indicated by arrow 72. Those skilled in the art will recognize that coining is meant to describe an operation of punching less than completely through base 52. Lock 70 is included within the bulk of encapsulant 66 and anchors the encapsulant to the base. The relationship between the plane of the surface 68 of encapsulant 66 and that of tongue 58 of base 52 may be clearly seen in FIG. 5. Those skilled in the art will recognize that the particular shape of lock 70 may be varied from that illustrated without departing from the true spirit and scope of this invention. For example, where base 52 is formed otherwise than by punching, lock 70 may be formed simultaneously therewith.

It is preferred in accordance with this invention that where base 52 is stamped as has been hereinabove described, from a strip of material, that the stamping be carried out in a way such that if a burr is formed around the edge of base 52 that such burr extend away from the remainder of the device, that is to say, toward the surface which is adapted to be mounted to an external heat exchanger. Similarly, although it may appear that lock 70 might be formed by coining from either surface of base 52, it is preferred that the coining be carried out from the surface opposite the mounting surface. By practicing this invention in accordance with these two considerations, it will be assured that the sharpest possible corners are achieved on the surface which mounts to the external heat exchanger surface. The importance of this will be seen subsequently when the method for forming encapsulant 66 is described.

FIG. 6 is a sectional detail view of the tongue portion of base 52 which shows lock 70 and, in exaggerated fashion, burrs 90 and 92 as may preferably be formed during the punching of the base. The arrow of FIG. 6 indicates the preferred mounting direction of the device in accordance with this invention, the arrow being understood to point towards the heat exchanger.

FIG. 7 illustrates base 52 prior to assembly of the remaining elements of a device in accordance with this invention for the purpose of more clearly showing the structure thereof. In particular, it will be noted that lock 70 surrounds tongue portion 58 of base 52 and further that tongue 58 is somewhat tapered in order to increase the locking of encapsulant 66 thereto. Preferably, base 52 may have a thickness of about 0.05 inches and surface 54 thereof should preferably be finished to a grind finish. Those skilled in the art will recognize that these dimensions may be varied somewhat from the values indicated herein but that these values represent what is currently considered to be the best mode for practicing this invention in conjunction with a package of the type thus far described.

Encapsulant 66 may conveniently be formed of several materials. Epoxy and silicone rubber represent two materials for forming encapsulant 66 which provide good results. It is required that whatever encapsulant is selected, sufficient mechanical strength be provided so that leads 60, 62, and 64 are securely held thereby. Further, the encapsulant should be selected to have good thermal compatibility with base 52 and with the semiconductor element. Still further, the encapsulant should be resistant to the operating environment of the device. Still further, the encapsulant should be of a type which will particularly well withstand repeated heatings and coolings without degradation. It has been found that silicone molding compound and preferably Dow Corning ®-306 manufactured by Dow Corning Corporation provides good results. Preferably the encapsulant is formed on a device of the type illustrated in FIGS. 4 through 7 by transfer molding. After molding, the encapsulant is preferably cured at an elevated temperature for a time depending upon the particular encapsulants employed. Encapsulant of the type hereinabove described is preferably cured at about 350° F. for three minutes while epoxy may be cured at a similar temperature for less than about one minute.

FIGS. 8 and 9 illustrate a mold suitable for forming a device in accordance with this invention. The mold includes an upper half 86 and a lower half 72. The upper half 86 of the mold determines the shape of the upper portion of encapsulating region 66. The lower half 72 of the mold includes a plurality of recesses 74, 76, 78, and 80 which receive the tongue portions of a like plurality heatsinkable bases of which only two, 82 and 84, are illustrated. These recesses have a depth equal to the distance "d" between surfaces 68 and 69 and as shown for example in FIG. 5. The cooperation of these recesses, the upper and lower halves, and the thermally conducting base are illustrated at FIG. 9. Base 82 is disposed within recess 76 of mold base 72. It will be observed that in order to provide for slight variations in the size of the thermally conducting base that recess 76 is made slightly wider than base 80. Preferably, a clearance of about 0.005" is provided to assure non-interference of molds and heatsink. The thin web of encapsulation material entering this clearance area during molding will be eroded below surface 69 during deflash and subsequent operations. Upper mold half 86 cooperates with lower mold half 72 to form a chamber 88 in which encapsulating body 66 is formed by introducing encapsulant therein, curing the encapsulant and removing the mold halves.

The cooperation of burrs 90 and 92 with the lower mold member 72 may be easily seen in FIG. 9. Burrs 90 and 92 which in fact are two portions of a single continuous burr form a sealing rim around the outside edge of heatsinkable base 82. Positive sealing is thereby effected between the lower mold member and the heatsinkable base for preventing any encapsulant from coming into contact with surface 69.

In some cases where the difference in size between heatsink 82 and recessed region 76 is sufficiently large a narrow rim 94 of encapsulating material 92 may be formed around the bottom edge of heatsink 80. This rim is easily removed so as not to interfere with the mounting of the device. A presently preferred method for at least partially removing rim 94 is to deflash the completed device with electronic grade walnut shucks at a pressure in the range of about 30–50 psi. This deflashing may be accomplished very rapidly due to the small size of the rim of encapsulant, unlike attempts to deflash the device of FIG. 1 of the prior art which would require milling or grinding, or the like.

The relationship of a device in accordance with this invention with the lower mold member after removal of the upper mold member is shown at FIG. 10.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. A semiconductor device manufacturable by molding of an encapsulating body onto an integral heat sink adapted for mounting to an external heat sink comprising:
   a semiconductor element mounted in heat transfer relationship with said integral heat sink;
   a peripheral burr on said integral heat sink extending away from said body for cooperating with a mold member during manufacture to keep a mounting surface of said body free from encapsulant;
   an encapsulating body surrounding said semiconductor element and a portion of said integral heat sink and having a lower major surface spaced from a lower surface of said integral heat sink a distance sufficient to insure that said major surface of said encapsulating body does not interfere with an interface between said integral heat sink and an external heat sink and a narrow rim portion surrounding said burr for easy removal without removal of any substantial amount of material from said major surface.

2. The device of claim 1 further comprising peripheral locking means extending outwardly from sidewalls of said integral heatsink and included within said encapsulating body for mechanically coupling said body to said integral heatsink.

3. The device of claim 1 wherein said encapsulating body comprises a material selected from the Group consisting of epoxy and silicone.

4. The method of claim 1 further comprising a layer of electrically insulating material disposed between said semiconductor element and said integral heatsink.

5. The device of claim 1 further comprising a plurality of leads connected to said semiconductor element and mechanically supported by and extending outside of said body for providing electrical connection to said element.

6. The device of claim 1 wherein said narrow rim portion has a height less than about 0.005 inches and a width less than about 0.005 inches.

7. The device of claim 1 wherein said distance is between 0.001 and 0.005 inches.

* * * * *